United States Patent [19]

Guterman

[11] 4,367,580
[45] Jan. 11, 1983

[54] PROCESS FOR MAKING POLYSILICON RESISTORS

[75] Inventor: Daniel C. Guterman, Houston, Tex.

[73] Assignee: Texas Instruments Incorporated, Dallas, Tex.

[21] Appl. No.: 132,702

[22] Filed: Mar. 21, 1980

[51] Int. Cl.³ ............................................. H01L 21/22
[52] U.S. Cl. .................................. 29/571; 29/577 C; 148/187; 357/59
[58] Field of Search .............. 29/577 C, 571; 148/187, 148/1.5; 357/59

[56] References Cited

U.S. PATENT DOCUMENTS

| | | | |
|---|---|---|---|
| 3,984,822 | 10/1976 | Simko et al. | 357/59 X |
| 4,055,444 | 10/1977 | Rao | 148/1.5 |
| 4,110,776 | 8/1978 | Rao et al. | 357/51 X |
| 4,112,509 | 9/1978 | Wall | 357/59 X |
| 4,187,602 | 2/1980 | McElroy | 29/577 R |
| 4,208,781 | 6/1980 | Rao et al. | 29/577 C |
| 4,209,716 | 6/1980 | Raymond | 357/23 X |
| 4,246,593 | 1/1981 | Bartlett | 357/59 X |
| 4,258,378 | 3/1981 | Wall | 357/59 X |
| 4,258,466 | 3/1981 | Kuo et al. | 357/59 X |
| 4,265,685 | 5/1981 | Seki | 29/571 X |
| 4,285,117 | 8/1981 | Heeren | 29/571 |

*Primary Examiner*—G. Ozaki
*Attorney, Agent, or Firm*—John G. Graham

[57] ABSTRACT

Polycrystalline silicon resistor elements are formed in MOS integrated circuits by a method which requires no additional mask and etch steps other than a standard double-level poly process. The resistors are defined in first level polysilicon which also forms floating gates in FAMOS devices. The resistors are masked by the second level poly which is patterned to define control gates for the FAMOS cells at the same time as the resistor mask is created. The first level poly is implanted at a level which produces the desired resistivity, which is same as the necessary doping level for the floating gates. FAMOS cells are floating gate MOS transistors which are electrically programmable and may also be electrically erasable or electrically alterable.

6 Claims, 7 Drawing Figures

PROCESS FOR MAKING POLYSILICON RESISTORS

BACKGROUND OF THE INVENTION

This invention relates to semiconductor devices and methods of manufacture, and more particularly to implanted polysilicon resistor devices made by processes included in manufacture of electrically programmable memory devices.

In U.S. Pat. No. 4,110,776 issued to Rao, Stanczak, Lien and Bhatia, assigned to Texas Instruments, an implanted polycrystalline silicon resistor is disclosed. Similarly, implanted resistors in second-level polysilicon are disclosed in application Ser. No. 801,699, filed May 31, 1977, now U.S. Pat. No. 4,209,716 to J. H. Raymond, assigned to Texas Instruments. Resistors of this type have formed widespread use in static RAM devices.

The prior processes for forming polysilicon resistors required mask and etch sequences to be performed on the slice, in addition to the standard N-channel silicon gate single-level or double-level poly processes. Any added photoresist steps such as this will cause additional costs, and also reduce yields.

It is the principal object of this invention to provide an improved method of making resistors in integrated circuits, and an improved resistor made by such method. Another object is to provide a device of reduced cell size. An additional object is to provide resistors along with an array of FAMOS cells, made by a more efficient method. A further object is to provide a method of forming implanted polysilicon resistors while using N-channel double-level polysilicon processes such as used for making EPROM arrays.

SUMMARY OF THE INVENTION

In accordance with an illustrative embodiment of the invention polycrystalline silicon resistor elements are formed in MOS integrated circuits by a method which requires no additional mask and etch steps other than N-channel double-level poly process. The resistors are defined in first level polysilicon which also forms floating gates in EPROM devices. The resistors are masked by the second level poly which is patterned to define control gates for the FAMOS cells at the same time as the resistor mask is created. The first level poly is implanted at a level which produces the desired resistivity, which is same as the impurity doping level for the floating gates.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
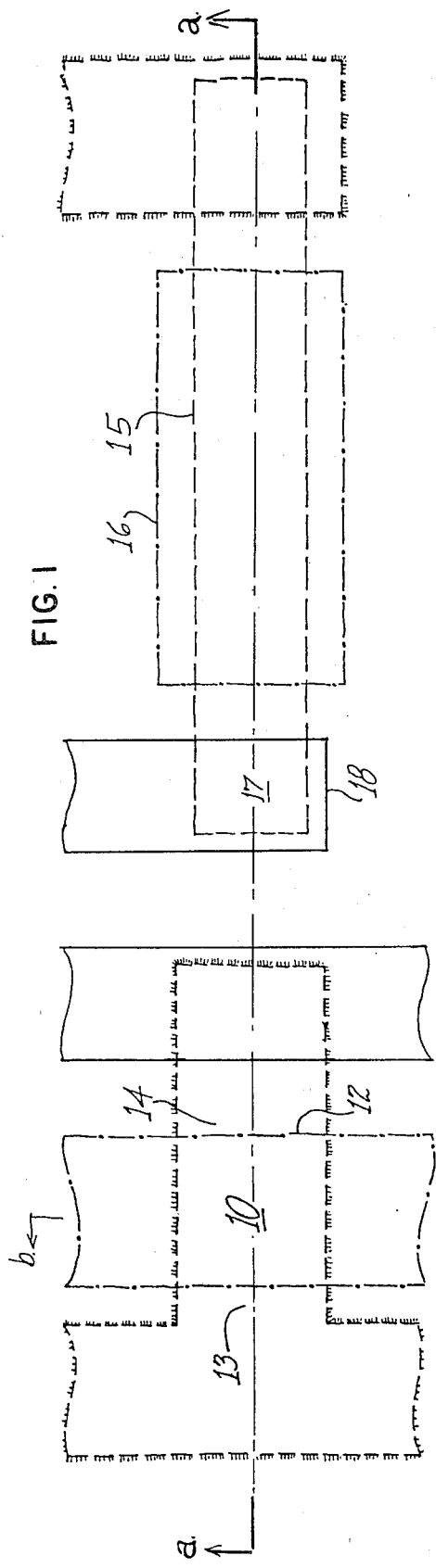
FIG. 1 is a greatly enlarged plan view of a small portion of a semiconductor chip showing the physical layout of an EPROM cell with a resistor made according to the invention.
Figure 2A:
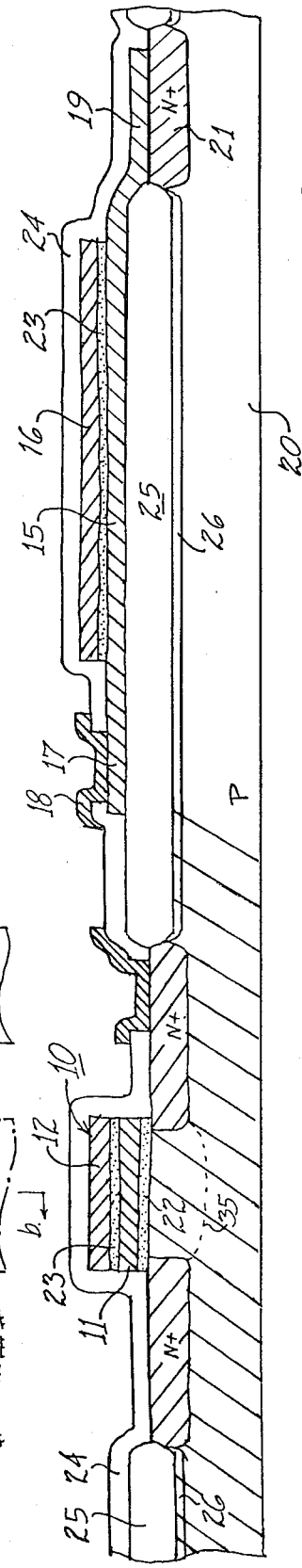
FIGS. 2a and 2b are elevation views in section of the cells of FIG. 1, taken along the lines a—a and b—b of FIG. 1, respectively.
Figure 2B:
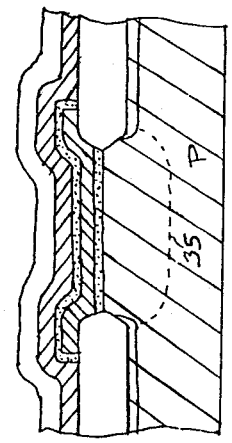

Referring to FIGS. 1 and 2a–2b, a semiconductor device is shown which employs a resistor made by the process of the invention. An electrically programmable read-only-memory (EPROM) cell 10 is formed in a face of a silicon body and includes a first level polysilicon floating gate 11, a second level polysilicon control gate 12, and N+ source and drain regions 13 and 14. Typically, there may be an array of 16,384 such cells 10 on a single chip, for example, which would require 128 row address lines forming the control gates 12 and 128 output column lines contacting the drain regions 14. At another location on the face of the chip, spaced from the cell 10, is a resistor 15 which is formed by the same first level polysilicon layer that creates the floating gate 11. A segment 16 of the second level polysilicon which creates the control gate 12 overlies the resistor 15 and acts as a mask in forming contacts for the resistor or in defining the geometry of the resistor. Although various types of contacts may be used, two are illustrated as examples. A contact area 17 on one end is engaged by a metal contact 18, and a contact area 19 on the other end makes connection to the silicon bar 20 at an N+ region 21 which is created at the same time as the source and drain regions 13 and 14.

The first level polysilicon is separated from the face of the silicon at the cell 10 by a gate oxide layer 22. Another thermal silicon oxide layer 23 separates the second level poly from the first level, i.e., between the control gate 12 and floating gate 11 as well as between the mask 16 and resistor 15. A layer 24 of deposited oxide separates the metal level from the polysilicon. Thermal field oxide 25 covers the face of the silicon bar 20 except in the moat areas such as N+ diffused regions 21 and cells 10. A P+ channel stop region 26 underlies all field oxide as is the usual practice.

The resistor 15 and others like it would be used for various purposes in peripheral circuits such as input protection devices, buffers, clock generators, and the like. The important feature is that the resistor is created by the standard double-level polysilicon process used for making EPROM devices, with no additional mask steps needed as had been the case in prior methods. The second level poly which is patterned anyway to define the control gates and row lines, also defines the resistor 15.

Turning now to FIGS. 3a–3d, a process for making the resistor and EPROM array according to the invention will be described. The right hand side of these FIGURES corresponds to the resistor in the section view of FIG. 2a, while the left hand side shows the EPROM transistor. The starting material is a slice of P-type monocrystalline silicon; in the FIGURES the portion of the slice shown as the silicon bar 20 represents only a very small undivided part of the slice, perhaps 1 or 2 mils wide. After appropriate cleaning, the slice is oxidized by exposing to oxygen in a furnace at an elevated temperature (perhaps 1100° C.) to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 25 and the P+ channel stop 26. The resist is developed, leaving areas where nitride is then etched away by a nitride etchant, removing the exposed part of the nitride layer 32 but leaving in place the oxide layer 31.

Using photoresist and nitride as a mask, the slice is now subjected to an ion implant step to produce the channel stop regions 26 whereby boron atoms are introduced into unmasked regions 33 of silicon as is standard practice. The regions 33 do not exist in the same form in the finished device, because some of this part of the slice will be consumed in the field oxidation procedure. P+ tank regions 35 may also be created at this point by another implant. An anneal step in nitrogen usually follows, as set forth in U.S. Pat. No. 4,055,444, assigned to Texas Instruments.

Figure 3A:
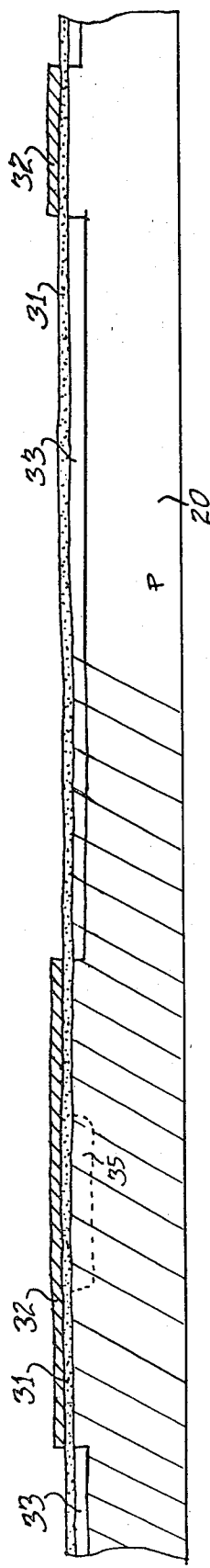
FIGS. 3a–3d are elevation views in section of the cell array of FIG. 1, at successive stages in the manufacturing process, taken generally along the lines a—a in FIG. 1.
Figure 3B:
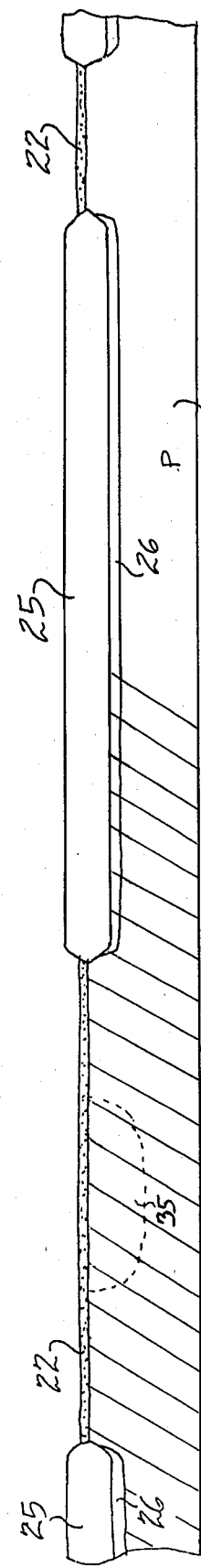

The next step in the process is formation of field oxide 25, which is done by subjecting the slices to steam or an oxidizing atmosphere at high temperature for several hours. This causes a thick field oxide layer 25 to be grown where not masked by nitride, as seen in FIG. 3b. This region extends into the silicon surface because silicon is consumed as it oxidizes. The thickness of this layer 25 is about 10,000 A, part of which is above the original surface and part below. The boron doped P+ regions 33 formed by implant will be partly consumed, but will also diffuse further into the silicon ahead of the oxidation front, producing P+ channel stop regions 26 much deeper than the original regions 33.

Next the remaining nitride layer 32 and the oxide 31 are removed by etching, and the exposed silicon cleaned. The gate oxide 22 is grown by thermal oxidation to a thickness of about 500 Å. In areas of the slice where depletion load devices are required, although not pertinent to this invention, a masked ion implant step would be done at this point. Likewise, the threshold voltage of the enhancement mode transistors in the EPROM array or periphery may be adjusted by ion implant. Also, windows for first level polysilicon to silicon contacts, such as the contact area 19, are patterned and etched at this point using photoresist.

Figure 3C:
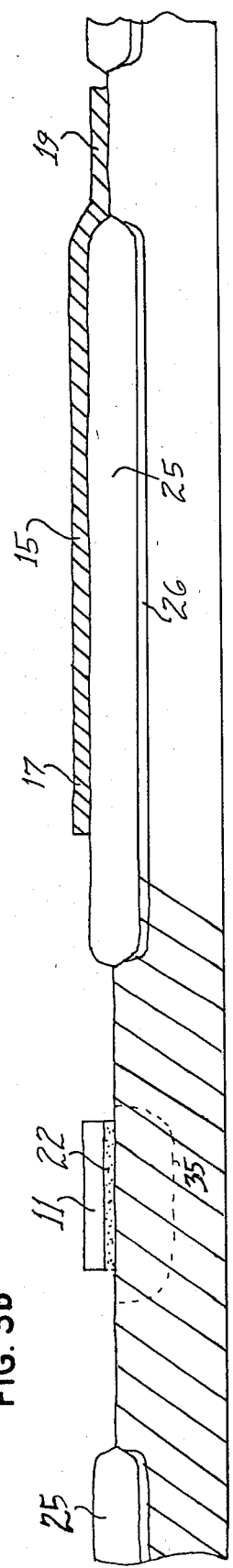

As seen in FIG. 3c a first level of polycrystalline silicon is deposited over the entire slice in a reactor using standard techniques to a thickness of about 10000 Å. According to the invention, the first level poly is subjected to a light N- implant at this point, which defines the resistivity of the resistor 15 and properly dopes the floating gate 11. The implant level is discussed below. The first level polysilicon layer is then patterned by applying a layer of photoresist, exposing to ultraviolet light through a mask prepared for this purpose, and developing, so the remaining photoresist masks the floating gates 11 and the resistor 15, as well as contact areas 17 and 19 for the resistor. The unmasked polycrystalline silicon is etched away, leaving the gates 11 in the EPROM array, as well as the resistors.

In EPROM manufacturing processes as disclosed in U.S. Pat. Nos. 4,112,509 or 3,984,822, an arsenic implant is performed after the floating gate is defined (usually after the thin thermal oxide interlevel insulator layer 23 is grown). This arsenic implant created extensions of the source and drain regions beneath the control gate.

Figure 3D:
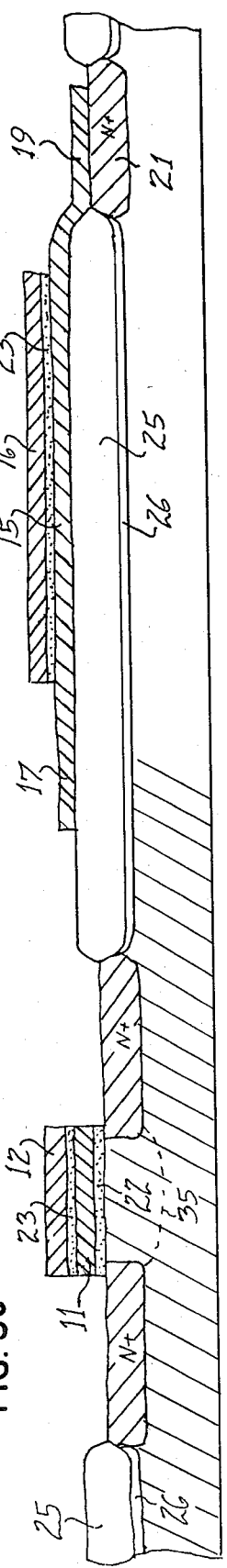

The next step in the process is forming of the second level polysilicon control gate and mask 16. First, the slice is subjected to a thermal oxidation step to create the oxide coating 23 over the first level poly gate 11, as well as over the surface of the resistor 15 and contact regions 17 and 19. Then, a photoresist mask and etch operation opens holes in the oxide 23 for poly-to-poly contacts if any (none shown). Next, the second level of polycrystalline silicon is deposited using standard methods as before. A photoresist operation is now used to define the control gate 12 and mask 16; this operation also in effect defines the mask for the N+ implant. An arsenic implant or phosphorus diffusion is then performed to create the source and drain regions and to dope the contact areas 17 and 19 and form the region 21 in the silicon, as seen in FIG. 3d.

A thick layer 24 of silicon oxide is deposited by decomposition of silane at a low temperature, about 400° C. This layer insulates the metal level from the polycrystalline silicon and is referred to as multilevel oxide. The multilevel oxide layer 24 is patterned by a photoresist operation, exposing contact areas for metal-to-polysilicon contact 18, as well as contact areas for metal contacts and inter-connections used in the cell array and/or in the periphery of the chip in the input buffers, decoders, sense amplifiers, and the like. The metal contacts and interconnections are made in the usual manner by depositing a thin film of aluminum over the entire top surface of the slice then patterning it by a photoresist mask and etch sequence. This leaves metal strips which are usually the Y output or column lines, as well as the contact 18.

A thick protective oxide layer (not shown) covers the metallization, with aperatures etched in this layer above bonding pads. This layer is non-thermal oxide deposited at low temperature in accord with standard MOS manufacturing methods. Usually this oxide covers everything except the bonding pads on a bar.

The implant dosage for defining the resistivity of the first level poly, and thus the resistor 15, is of the same magnitude as disclosed in U.S. Pat. No. 4,110,776 or 4,209,776. This dosage also produces the desired level in the floating gates 11. In one example, a phosphorus implant dose of $1 \times 10^{14}$ per sq. cm. produced an average resistance of 4.7 Megohm per sq.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a resistor element in an integrated semiconductor device of the type having at least one active circuit element at a face of a semiconductor body, comprising the steps of:
   depositing a first layer of polycrystalline silicon on said face,
   introducing conductivity-determining impurity into said first layer to establish a first level of impurity doping therein,
   patterning said first layer to define a resistor area and a first electrode area for said active circuit element, the resistor area and the first electrode area being spaced from one another on said face,
   depositing a second layer of conductive material on said face overlying said first layer but insulated therefrom, and patterning said second layer to define a mask area over part of said resistor area and a second electrode area for said active circuit element.

2. A method according to claim 1 wherein the second electrode area overlies the first electrode area.

3. A method according to claim 2 wherein the second layer is polycrystalline silicon and after patterning said second layer a second step of introducing conductivity-determining impurity is performed.

4. A method according to claim 3 wherein said second step of introducing impurity establishes a second level of impurity doping in contact regions of said resistor area where the resistor area is not covered by said second layer, said second level being much higher than said first level.

5. A method according to claim 4 wherein said active circuit element is a floating gate electrically programmable memory cell and said first and second electrode areas are floating gate and control gate.

6. A method according to claim 5 wherein said second step of introducing impurity forms source and drain regions for said memory cell.

* * * * *